United States Patent
Mari Curbelo et al.

(10) Patent No.: US 9,948,290 B2
(45) Date of Patent: Apr. 17, 2018

(54) REVERSE CONDUCTION MODE SELF TURN-OFF GATE DRIVER

(71) Applicant: General Electric Company, Schenectady, NY (US)

(72) Inventors: Alvaro Jorge Mari Curbelo, Unterschleissheim (DE); Thomas Zoels, Unterschleissheim (DE)

(73) Assignee: General Electric Company, Schenectady, NY (US)

( * ) Notice: Subject to any disclaimer, the term of this patent is extended or adjusted under 35 U.S.C. 154(b) by 52 days.

(21) Appl. No.: 14/520,508

(22) Filed: Oct. 22, 2014

(65) Prior Publication Data

US 2015/0035585 A1  Feb. 5, 2015

Related U.S. Application Data

(63) Continuation-in-part of application No. 13/219,219, filed on Aug. 26, 2011, now abandoned.

(51) Int. Cl.

| H03K 17/296 | (2006.01) |
|---|---|
| H03K 17/28 | (2006.01) |
| H03K 17/567 | (2006.01) |
| H03K 17/082 | (2006.01) |
| H02M 1/08 | (2006.01) |
| H03K 17/16 | (2006.01) |
| H03K 17/06 | (2006.01) |

(52) U.S. Cl.
CPC ......... *H03K 17/28* (2013.01); *H03K 17/0822* (2013.01); *H03K 17/168* (2013.01); *H03K 17/567* (2013.01); *H02M 1/08* (2013.01); *H03K 17/165* (2013.01); *H03K 2017/066* (2013.01); *H03K 2217/0027* (2013.01); *H03K 2217/0036* (2013.01)

(58) Field of Classification Search
CPC .......... H03K 17/28; H03K 5/13; H03K 5/133; H03K 17/567; H03K 17/60; H03K 17/0822; H03K 2217/0036; H03K 2217/0027; H03K 17/168; H03K 2017/066; H03K 17/16; H02M 1/08; H02M 1/081; H02M 1/082; H02M 1/083; H02M 1/084; H02M 1/0845; H02M 1/088; H02M 1/092; H02M 1/096
USPC .......................................................... 327/393
See application file for complete search history.

(56) References Cited

U.S. PATENT DOCUMENTS

| 2009/0052211 A1* | 2/2009 | Asai | H02M 7/5387 363/56.05 |
|---|---|---|---|
| 2010/0102788 A1* | 4/2010 | Kuroyabu | H02M 3/156 323/282 |
| 2016/0036433 A1* | 2/2016 | Toshiyuki | H02M 7/538 327/109 |

* cited by examiner

*Primary Examiner* — Patrick Chen
(74) *Attorney, Agent, or Firm* — GE Global Patent Operation; John A. Kramer

(57) ABSTRACT

An apparatus includes a switch module, a sense circuit coupled to the switch module and configured to indicate an operating conduction mode of the switch module, and a drive circuit operatively coupled to the switch module to enable and disable forward conducting mode of the switch module. Once the switch module is in forward conducting mode, the drive circuit is configured to maintain enablement of the forward conducting mode even if the sense circuit indicates reverse conduction mode.

18 Claims, 12 Drawing Sheets

REVERSE CONDUCTION MODE SELF TURN-OFF GATE DRIVER

CROSS REFERENCE TO RELATED APPLICATIONS

This application is a continuation in part of U.S. patent application Ser. No. 13/219,219 titled "Reverse Conduction Mode Self Turn-Off Gate Driver," filed Aug. 26, 2011, and claims priority to the same under 35 U.S.C. § 120. U.S. patent application Ser. No. 13/219,219 is incorporated herein in its entirety.

BACKGROUND

Technical Field

Exemplary embodiments of the invention relate generally to a system and method for improving the reliability and efficiency of an electronic device such as an inverter. Moreover, such exemplary embodiments may relate to an improved drive circuit for voltage controlled power switches.

Discussion of Art

Power electronic devices may be used in a wide variety of systems and devices for delivering power to a load. For example, traction vehicles such as locomotives employ electric traction motors for driving wheels of the vehicles. In some of these vehicles, the motors are alternating current (AC) motors whose speed and power are controlled by varying the frequency and the voltage of AC electric power supplied to the field windings of the motors. Commonly, the electric power is supplied at some point in the vehicle system as DC power and is thereafter converted to AC power of controlled frequency and voltage amplitude by a power electronic device such as an inverter. Power electronic devices may also be used in a variety of other applications, such as industrial power electronics, and stationary power conversion, among others. The power electronic device may include a set of semiconductor-based voltage controlled power switches (VCPS) such as reverse blocking insulated gate bipolar transistors (IGBTs), reverse conducting insulated gate bipolar transistors (RC-IGBTs), bi-mode insulated gate transistors (BIGTs), and the like. RC-IGBTs and BIGTs are reverse conductive power switches (RCPSs) which form a subgroup within the VCPS.

BRIEF DESCRIPTION

Briefly, in accordance with an exemplary embodiment of the invention, an apparatus comprises a switch module; a sense circuit coupled to the switch module and configured to indicate an operating conduction mode of the switch module; and a drive circuit operatively coupled to the switch module to enable and disable forward conducting mode of the switch module. Once the switch module is in forward conducting mode, the drive circuit is configured to maintain enablement of the forward conducting mode even if the sense circuit indicates reverse conduction mode.

In other embodiments, a system comprises a first switch module coupled to a DC rail voltage and configured to switch on and off in an alternation with a second switch module to produce an output AC waveform; a drive circuit operatively coupled to the first switch module and configured to enable and disable a forward conducting mode of the first switch module; and a sense circuit configured to determine an operating conduction mode of the first switch module. Once the switch module is in forward conducting mode, the drive circuit is configured to maintain enablement of the forward conducting mode even if the sense circuit indicates reverse conduction mode.

Other aspects provide a method, which includes determining an operating mode of a switch module; ignoring a command to enable forward conducting mode of the switch module, in the event that the switch module is operating in reverse conduction mode; accepting the command to enable forward conducting mode of the switch module, in the event that the switch module is not operating in reverse conduction mode; and ignoring indications that the switch module is operating in reverse conduction mode during a time between receipt of the command to enable forward conducting mode and receipt of a command to disable forward conducting mode.

Another exemplary embodiment provides a power electronic module that comprises a switch module; a sense circuit coupled to the switch module and configured to indicate an operating conduction mode of the switch module; and a drive circuit operatively coupled to the switch module and configured to enable a forward conducting mode of the switch module in response to receiving a forward mode enable command while the sense circuit does not indicate a reverse conduction mode. Once the switch module is in forward conducting mode, the drive circuit is configured to maintain enablement of the forward conducting mode of the switch module even if the sense circuit indicates reverse conduction mode, unless the drive circuit enabled forward conducting mode immediately in response to initial receipt of a forward mode enable command while the sense circuit did not indicate a reverse conduction mode.

DRAWINGS

These and other features, aspects, and advantages of the invention will become better understood when the following detailed description is read with reference to the accompanying drawings in which like characters represent like parts throughout the drawings, wherein.

DETAILED DESCRIPTION

Figure 1:
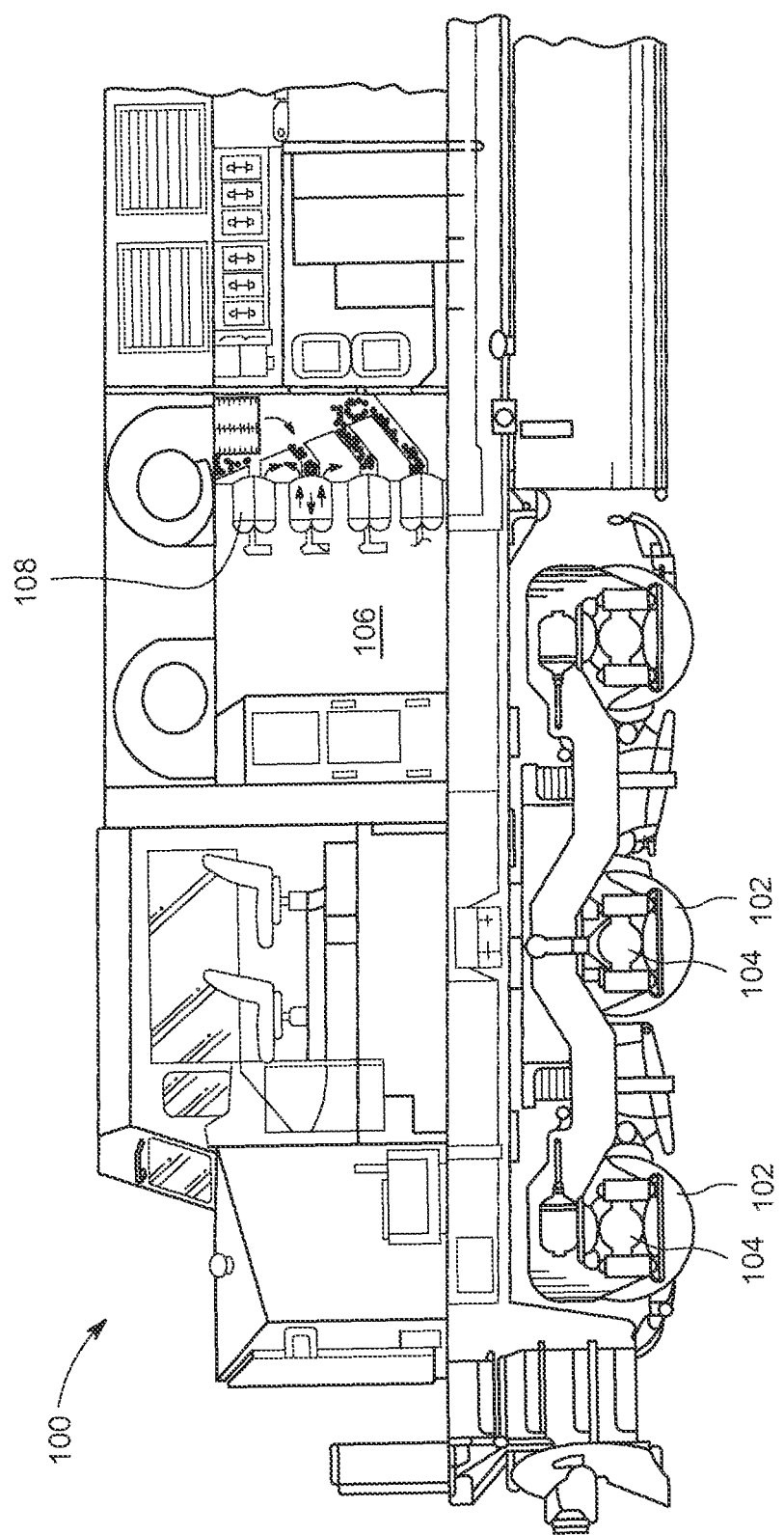
FIG. 1 is a block diagram of a diesel-electric locomotive that may employ an inverter in accordance with embodiments.

FIG. 1 is a block diagram of a diesel-electric locomotive that may employ an inverter in accordance with embodiments. The locomotive, which is shown in a simplified, partial cross-sectional view, is generally referred to by the reference number 100. A plurality of traction motors, not visible in FIG. 1, are located behind drive wheels 102 and coupled in a driving relationship to axles 104. A plurality of auxiliary motors, not visible in FIG. 1, are located in various locations on the locomotive, and coupled with various auxiliary loads like blowers or radiator fans. The motors may be alternating current (AC) electric motors. As explained in detail below, the locomotive 100 may include a plurality of electrical inverter circuits for controlling electrical power to the motors.

Figure 2:
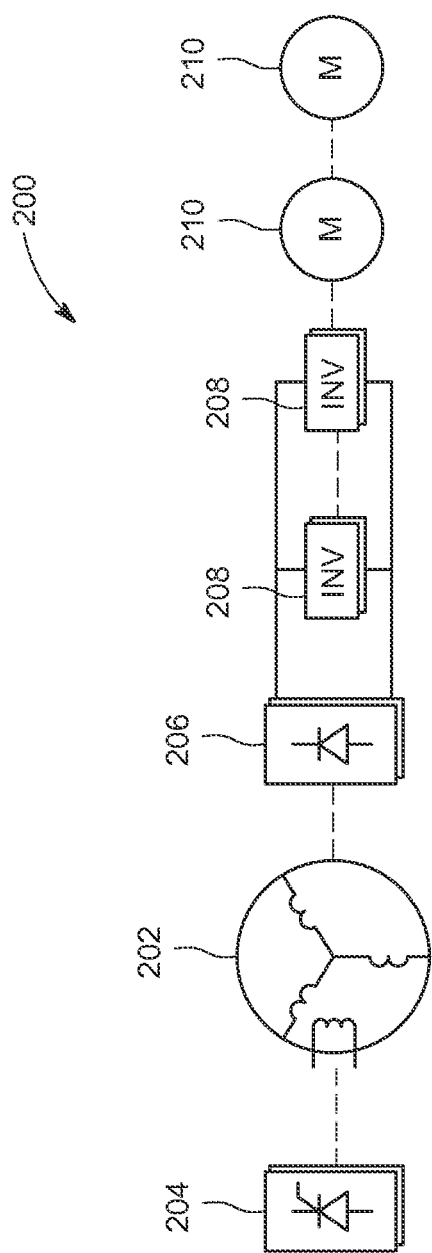
FIG. 2 is a block diagram of a power system in accordance with embodiments.

FIG. 2 is a block diagram of a power system in accordance with embodiments. The power system, which is generally referred to by the reference number 200, may be used to control AC power to a load. The power system 200 may include an alternator 202 driven by an on-board internal combustion engine such as a diesel engine (not shown). The power output of the alternator 202 is regulated by field excitation control indicated by a field control 204. Electrical power from alternator 202 is rectified by a rectifier 206, and coupled to one or more inverters 208. The inverters 208 may use high-power semiconductor-based voltage controlled power switches (VCPSs) to convert the DC power to AC power with variable frequency and variable voltage amplitude for application to one or more AC motors 210. Although two motors are shown, the locomotive may include four to six AC electric motors may be employed, each controlled by an individual inverter.

Referring again to FIG. 1, electrical power circuits are at least partially located in an equipment compartment 106. The control electronics for the inverters 208 and the field control 204 as well as other electronic components may be disposed on circuit boards held in racks in the equipment compartment 106. Within the equipment compartment 106, the VCPSs used in the power conversion may be mounted to air-cooled heat sinks 108. The inverter circuits in the power system of FIG. 2 are but one example of a power electronic device in accordance with the techniques disclosed herein. It will be appreciated that embodiments of the present techniques may be employed in any suitable power electronic device that delivers electrical power to a load, including industrial power electronics, and stationary power conversion, among others.

Figure 3:
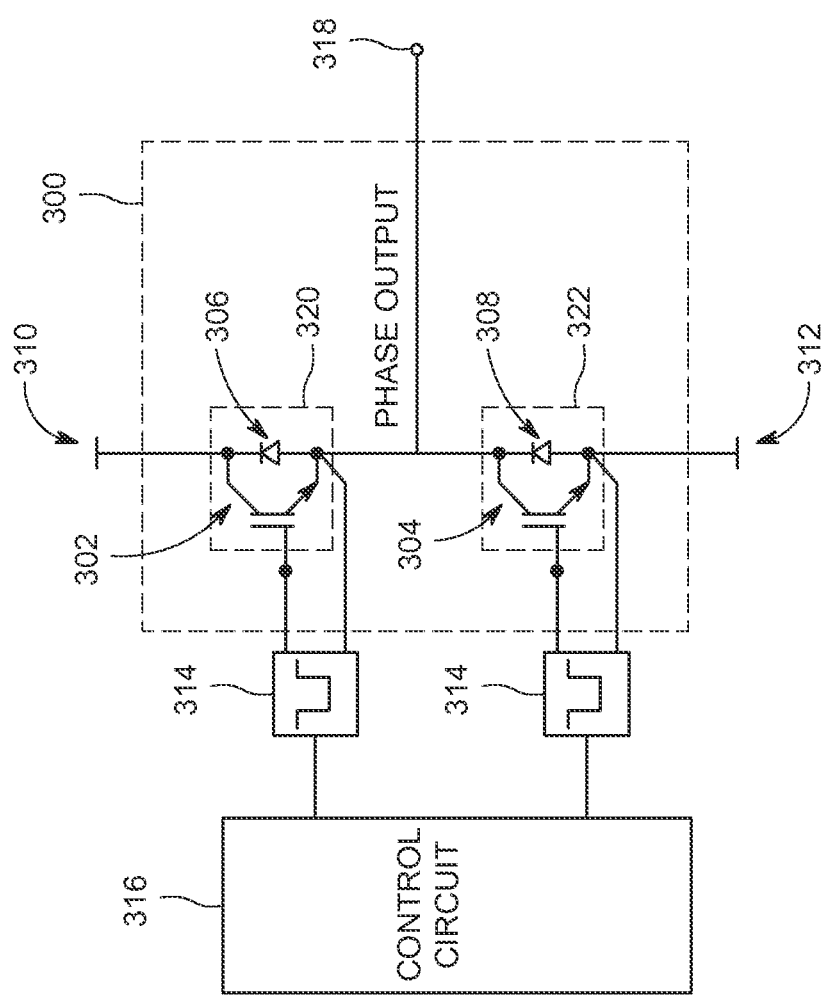
FIG. 3 is a block diagram of one leg of an IGBT inverter in accordance with embodiments.

As noted above, the inverters 208 used to generate the AC waveform may include VCPSs. A VCPS employs at least two power terminals and one or two control terminals. There are different naming conventions for the power terminals depending on the VCPS type, examples are anode and cathode or collector and emitter. When positive current through these power terminals is conducted from anode to cathode or from collector to emitter it is referred to as forward conduction. When positive current through the power terminals is conducted from cathode to anode or from emitter to collector it is referred to as reverse conduction. The same holds for the voltage across the power terminals where a positive voltage from anode to cathode or from collector to emitter is referred to as forward polarization and a positive voltage from cathode to anode or from emitter to collector is referred to as reverse polarization. In accordance with embodiments, the drive circuitry used to drive the switches may be configured to determine the polarity of the voltage across or the current through the power terminals of the switch. The drive signal produced by the drive circuitry may depend, at least in part, on the detected polarity. Depending on the type of switch used in the inverter, various benefits may be realized by controlling the drive signal based on the detected polarity. FIG. 3 is a block diagram of one leg of an IGBT inverter in accordance with embodiments. As shown in FIG. 3, the inverter leg 300 includes a pair of IGBTs referred to herein as upper IGBT 302 and lower IGBT 304. A diode, referred to herein as upper diode 306, is disposed in anti-parallel across the collector and emitter of the upper IGBT 302. A diode, referred to herein as lower diode 308, is disposed in anti-parallel across the collector and emitter of the lower IGBT 304. Each IGBT and corresponding anti-parallel diode (for example, upper IGBT 302 and upper diode 306) form a unit referred to herein as an IGBT module 320 and 322, which is one example of a switch module with a reverse blocking power switch (RBPS module). The diodes 306 and 308 provide a conductive path for freewheeling current, which is current that is generated, due to the inductance of the circuit and the load, when a current-conducting switch is turned off. The upper diode 306 provides a conductive path for freewheeling current that may result when the lower IGBT 304 is switched off. The lower diode 308 provides a conductive path for freewheeling current that may result when the upper IGBT 302 is switched off. The upper IGBT 302 and lower IGBT 304 are disposed in series between an upper rail voltage 310 and lower rail voltage 312. In certain embodiments, each of the IGBT modules 320 and 322 ("switch modules") is configured as a power switch module that is capable of conducting currents in excess of at least 100 Ampere.

Each IGBT 302 and 304 is driven by a gate driver 314 operatively coupled to the gate of the corresponding IGBT 302 and 304. A control circuit 316 may be operatively coupled to the gate drivers 314 to coordinate the switching of the IGBTs 302 and 304. The control circuit 316 may cause the IGBTs 302 and 304 to pulse on and off in an alternating fashion to produce an AC waveform at the phase output 318. To prevent a short circuit between the upper rail voltage 310 and the lower rail voltage 312, the drive signals for the IGBTs 302 and 304 are coordinated so that the IGBTs are not both turned on at the same time. For example, a time delay may be imposed between the time that one IGBT is switched off and the time that the other IGBT is switched on. This time delay is referred to herein as an interlock time and may be approximately 20 to 30 micro seconds, for example. Although only one leg 300 is shown, it will be appreciated that the inverter module may include two, three, or more legs, each providing an output AC waveform for a particular phase. For example, three legs may be used to produce a three-phase AC output waveform. A standard switching scheme is described further in relation to FIG. 5.

Figure 4:
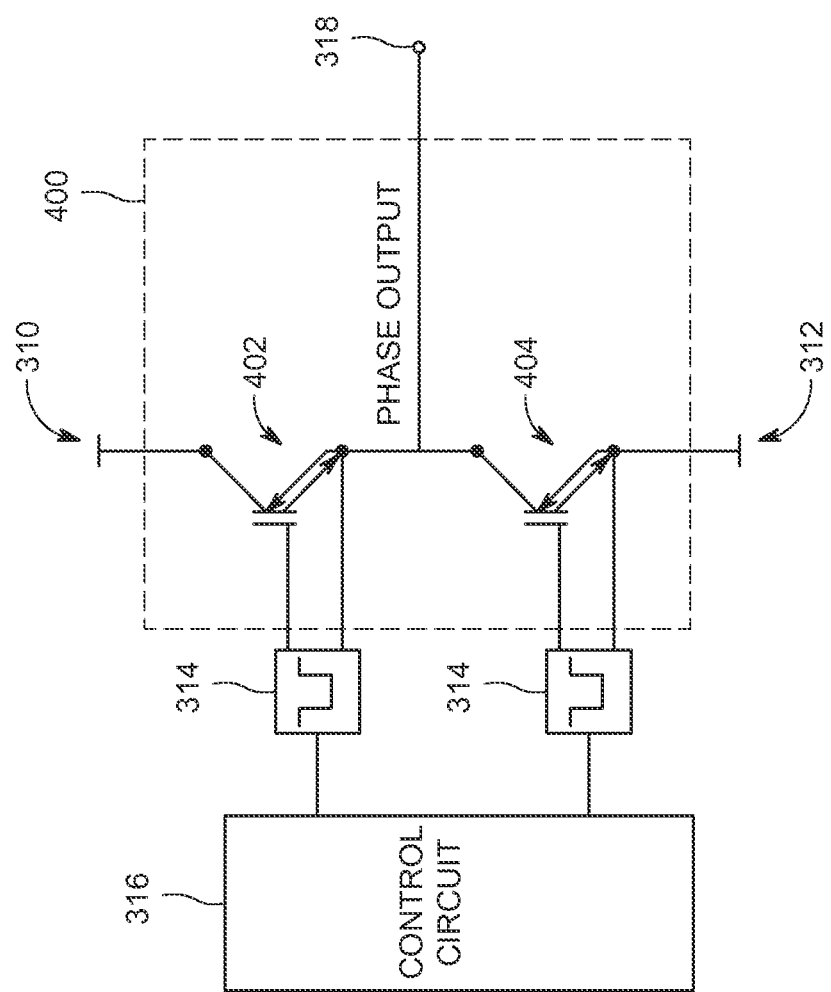
FIG. 4 is a block diagram of one leg of a BIGT inverter in accordance with embodiments.

FIG. 4 is a block diagram of one leg of a BIGT inverter in accordance with embodiments. As shown in FIG. 4, the inverter leg 400 includes a pair of BIGTs, referred to herein as upper BIGT 402 and lower BIGT 404. Each BIGT 402 and 404 form a unit may be referred to herein as a BIGT module, which can operate in a forward conducting mode or a reverse conduction mode. Each BIGT 402 and 404 is an example of a switch module with a reverse conducting power switch (RCPS module). As in the IGBT inverter of FIG. 3, each BIGT 402 and 404 is driven by a gate driver 314 operatively coupled to the gate of the corresponding BIGT 402 and 404. The gate driver 314 may provide one voltage level to enable the forward conducting mode of the BIGTs 402 and 404 and another voltage level to disable the forward conducting mode of the BIGTs 402 and 404. In embodiments, a gate voltage of +15 Volts will enable the forward conducting mode and a gate voltage of −15 Volts will disable the forward conducting mode.

The reverse conduction mode operation of the BIGTs 402 and 404 can be detected according to the polarity of the voltage across the emitter and collector of the BIGT 402 or 404. For example, the lower BIGT 404 will operate in reverse conduction mode if the voltage at the phase output 318 is lower than the voltage at the lower rail 312. When in reverse conduction mode, the BIGTs 402 and 404 provide a conductive path for freewheeling current that may result when the other BIGT in the leg 400 is switched off. The BIGTs 402 and 404 can operate in reverse conduction mode regardless of whether the gate voltage is positive or negative. During the reverse conduction mode operation of the lower BIGT 404, current is conducted from the lower rail 312 to the phase output 318.

The control circuit 316 may be operatively coupled to the gate driver 314 to coordinate the switching of the BIGTs 402 and 404. The control circuit 316 may cause the BIGTs 402 and 404 to pulse the forward conducting mode of the BIGTs 402 and 404 on and off in an alternating fashion to produce an AC waveform at the phase output 318. As described above in reference to FIG. 3, a time delay, referred to as the interlock time, is imposed between the time that one BIGT is switched off and the time that the other BIGT in the leg 400 is switched on. It will be appreciated that the BIGT inverter may also include two, three, or more legs, each providing an output AC waveform for a particular phase.

Figure 5:
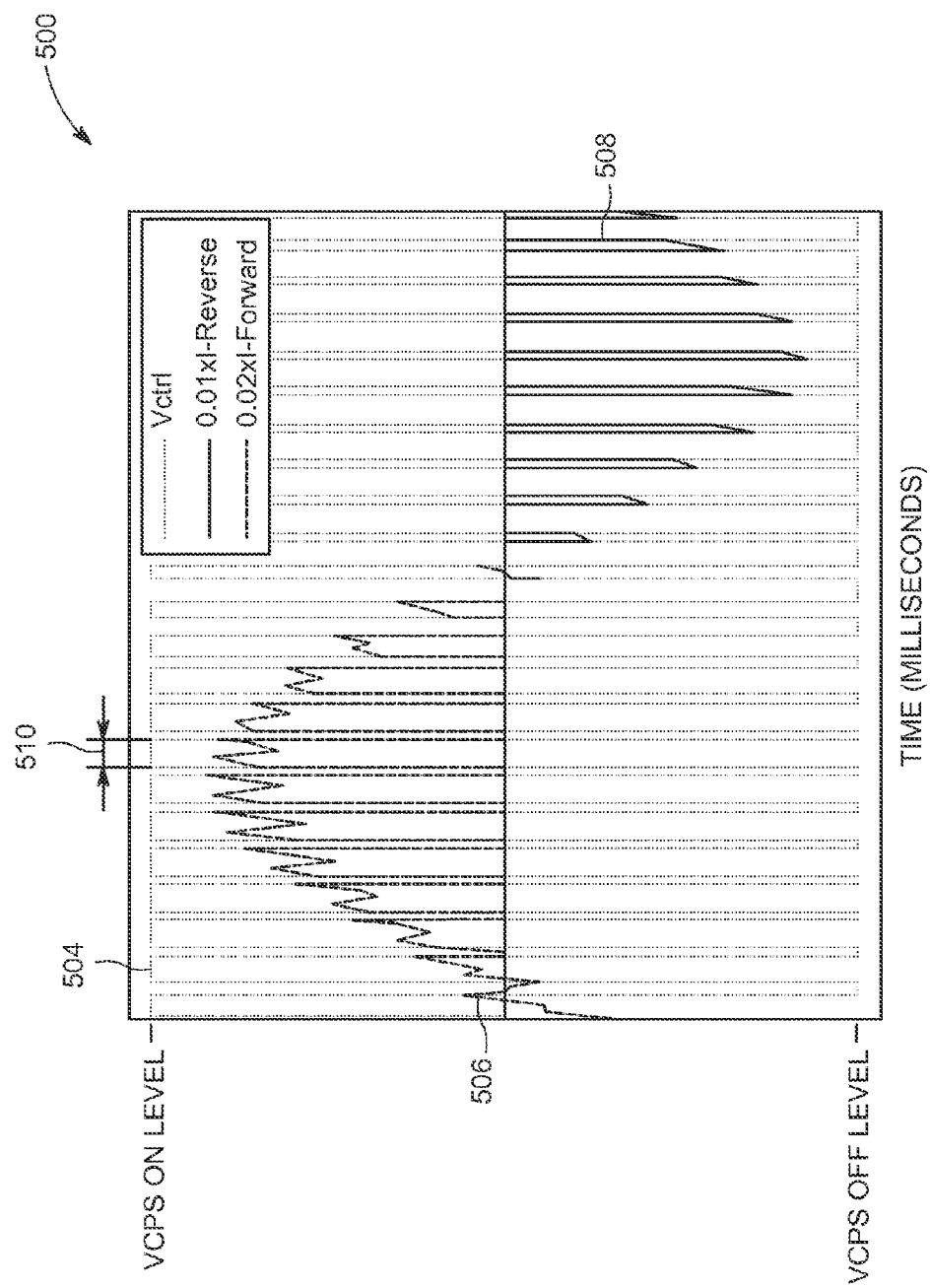
FIG. 5 is a graph of a switching scheme for a voltage controlled power switch (VCPS) two level (2L) inverter.

FIG. 5 is a graph of a switching scheme for a voltage controlled power switch (VCPS) inverter. In the case of an IGBT switch module as shown in FIG. 3, FIG. 5 plots a gate drive signal, Vge, as it is applied to upper IGBT 302 of FIG. 3 and is superimposed over the resulting currents generated in the upper IGBT 302 an upper diode 306 that is disposed in anti-parallel to the upper IGBT 302. The gate drive signal, Vge, is represented by the dotted line 504. The IGBT current is represented by the dashed line 506. The diode current is represented by the solid line 508. The X-axis represents time. The Y-axis represents voltage with respect to the gate drive signal and current with respect to the IGBT and diode currents.

As shown in FIG. 5, the gate drive signal 504 causes the upper IGBT 302 to be pulsed on and off to produce an output wave from with an approximately sinusoidal waveform. Although not shown, the upper IGBT 302 may be pulsed on and off in alternation with the lower IGBT 304 to produce a complimentary AC waveform that adds to the phase output. The resulting output waveform is generated by controlling the pulse width 510 of the drive signal 504. FIG. 5 shows approximately one period of the resulting output waveform.

For purposes of the present discussion, when current through a switch module is positive, the corresponding switch module is referred to as operating in forward conducting mode. When the voltage across the power terminals of the power switch is polarized in forward direction and the current through the switch module is about zero the switch module is referred to as operating in blocking mode. When the voltage across the power terminals of the switch module is polarized in the forward direction, the voltage across the control terminals determine if the switch module is in forward conduction or blocking mode. The control voltage level for enabling forward conducting mode is referred to as turn on level. The control voltage level for disabling forward conducting mode is referred to as turn off level. It will be appreciated that the polarity of the current through the switch module determines whether the switch module is in forward conducting mode or reverse conduction mode. For example, in the case of the lower IGBT module 322, if the current is flowing from the phase output 318 to the lower rail 312 (current positive), the lower IGBT module 322 is operating in forward conducting mode. If current is flowing from the lower rail 312 to the phase out 318 (current negative), the lower IGBT module 322 is operating in reverse conduction mode. It should be noted that, depending on the voltage across the collector and emitter of the switch module, the IGBT module may operate in reverse conduction mode even if forward conducting mode is enabled by the gate voltage applied to the IGBT.

During the first half of the period, the voltage across the power terminals of the switch module is polarized in forward direction and it operates alternating in forward conducting mode and blocking mode depending on the control voltage level. For example, current through the lower IGBT 304 is positive when the gate voltage is at +15V, and drops to zero when the gate voltage changes to −15V. The upper diode 306 conducts the resulting freewheeling current (not shown). During the first half of the period, the current in the lower switch module remains at zero. During the second half of the period, the lower switch module operates alternating in reverse conduction mode and blocking mode. When the upper switch module is switched off during the second half of the period, the lower switch module goes into reverse conduction mode and conducts the current from the upper switch module which has been switched off. The control voltage in the standard switching scheme of FIG. 5 is at turn on level even though the switch module is in reverse conducting mode.

Problems can arise in the second half of the period, when the lower switch module is conducting the freewheeling current. For example, in some circumstances, the upper switch module may turn on improperly due to a spurious triggering or cosmic particle. If this occurs, a short circuit between the phase output 318 and the upper rail 310 voltage is induced, creating an intra-module commutation, which means that the current through the switch module changes polarity. For example, with regard to the lower IGBT module in FIG. 3, the current commutates from the lower diode 308 to the lower IGBT 304. This change in polarity causes switch desaturation, which means that the voltage across the power terminals of the lower switch module rises and can create an unusually high voltage stress on the lower diode during the transition between conduction mode and blocking mode of the diode where for short time a current is flowing in a direction from the cathode to the anode. This voltage stress may lead to failure of the lower diode 308 and lower switch module failure. The same situation could occur with respect to the upper switch module if the lower switch module is improperly turned on.

To avoid a short circuit, the drive circuits may be configured to keep the corresponding control voltage at turn off level depending on the polarity of the current through the switch module. Referring to the lower switch module of FIGS. 3 and 4 as an example, a drive circuit incorporating the gate driver 314 may be configured to determine the polarity of the current in the lower switch module. If the current polarity indicates that the switch module is in reverse conduction mode, the lower switch module may be commanded by the gate driver 314 to remain off, even if the external trigger from the control circuit 316 is commanding the lower switch module to turn on. In this way, a spurious triggering of the upper switch module would not cause a short circuit, because the lower switch module would be switched off. The drive circuit for the upper switch module may be configured in the same manner. An exemplary switching scheme is described further in relation to FIG. 6. Exemplary drive circuit configurations are described further below with reference to FIGS. 7-9, 11, and 12.

In certain embodiments, there is provided a power electronic module that includes a switch module and a drive circuit operatively coupled to the switch module. The exemplary drive circuit is configured to enable and disable a forward conducting mode of the switch module. The power electronic module also includes a sense circuit configured to determine an operating conduction mode of the switch module. The drive circuit enables forward conducting mode of the switch module in response to receiving a forward mode enable command only while the switch module is not operating in reverse conduction mode. Once forward conducting mode is enabled, the drive circuit maintains forward conducting mode of the switch module even if the sense circuit indicates reverse conduction mode while forward conducting mode is enabled.

In the case of a reverse conductive switch module (RCPS module) such as the BIGT switch modules of FIG. 4, FIG. 5 plots a gate drive signal, Vge, as it is applied to the lower BIGT 404 of FIG. 4 and is superimposed over the resulting currents generated in the lower IGBT 404. Switch modules in general can operate in reverse conduction mode regardless of whether the control voltage is at turn on level or turn off level. However, in some embodiments of the RCPS module like the BIGT module, when the RCPS module is operating in reverse conduction mode, the RCPS will experience greater conduction losses if the control voltage of the same module is at turn on level. For example, with a BIGT module, if the lower BIGT 504 is operating in reverse conduction mode, the BIGT conduction losses will be higher if the gate voltage applied to the lower BIGT is +15 Volts (turn on level) and compared to −15 Volts (turn off level), in some cases up to 30 percent higher.

To improve the efficiency of the RCPS inverter, a drive circuit incorporating the gate driver 314 may be configured to disable the forward conducting mode of the RCPS module depending on the polarity of the current through the module. Referring to the lower BIGT 404 as an example, a drive circuit incorporating the gate driver 314 may be configured to determine the polarity of the current in the lower BIGT. If the current polarity indicates that the lower BIGT is operating in reverse conduction mode, the lower BIGT may be commanded by the drive circuit to disable forward conducting mode, even if the external trigger from the control circuit 316 is commanding the lower BIGT 404 to enable forward conducting mode. In this way, the gate voltage applied to the lower BIGT 404 will be different, e.g. lower, than the stationary on-value when operating in reverse conduction mode, resulting in more efficient operation of the inverter. The gate driver 314 for the upper BIGT 402 may be configured in the same manner.

Figure 6:
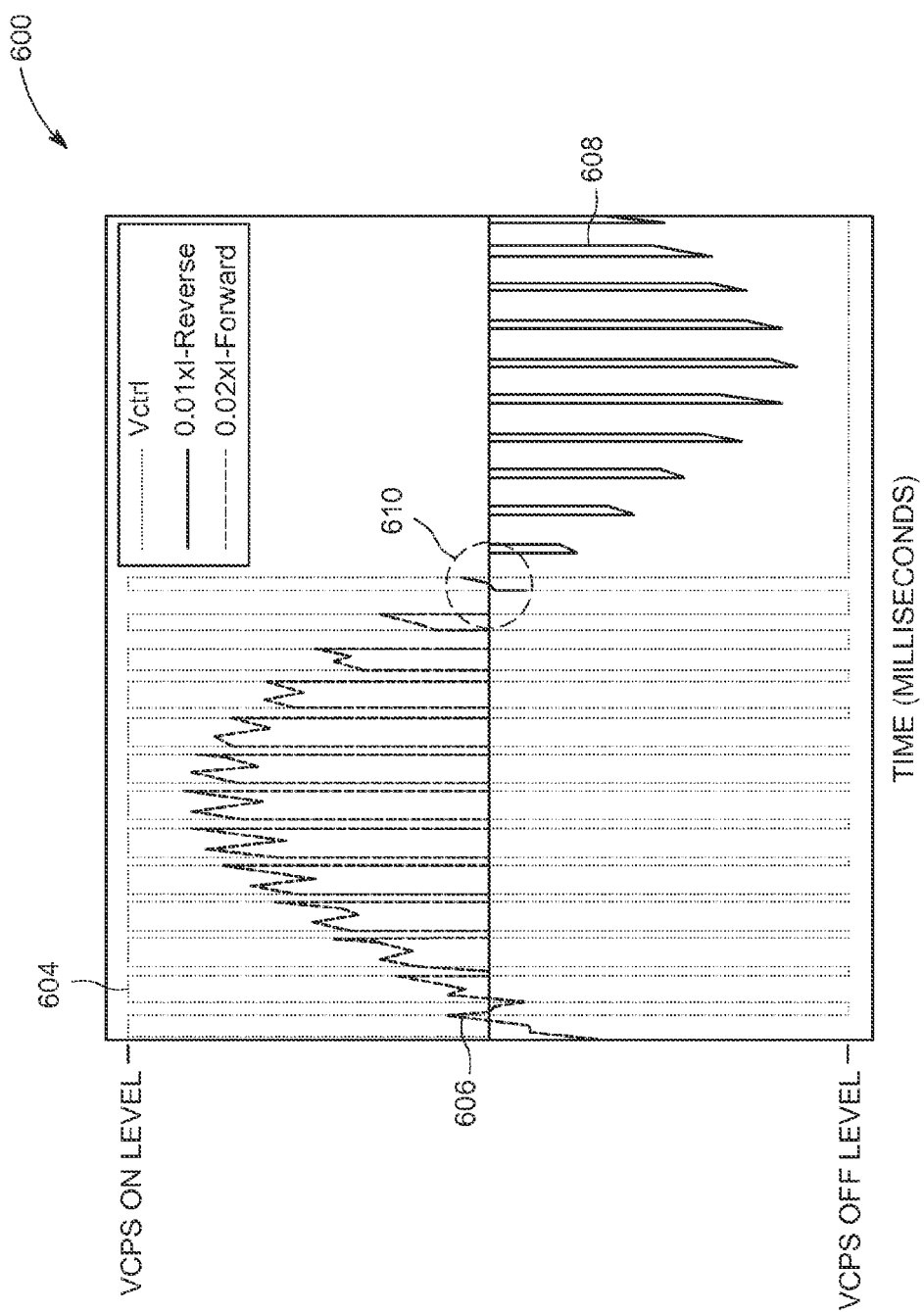
FIG. 6 is a graph of an exemplary switching scheme that may be employed in a 2L inverter, in accordance with embodiments.

FIG. 6 is a graph of an exemplary switching scheme that may be employed an inverter, in accordance with embodiments. The switching scheme may be employed in an inverter that uses any suitable type of power switch, including IGBTs, BIGTs, and reverse conducting IGBTs, among others. The diagram of FIG. 6, shows the gate drive signal and resulting currents induced in the switch module, wherein the switch module may be the upper or lower BIGT 402 or 404 or the upper or lower IGBT 302 or 304 in combination with the corresponding anti-parallel diode 306 or 308, for example.

The control voltage signal, Vctrl, is represented by the dotted line 604. The dashed line 606 represents the current in the switch module when operating in forward conducting mode. The solid line 608 represents the current in the switch module when operating in reverse conduction mode. As discussed in relation to FIGS. 3 and 4, the gate drive signal pulses the switch module between the turn on voltage level and the turn off voltage level, to generate the output AC waveform. For example, in the case of an IGBT 302 or 304, the turn on voltage level causes the IGBT 302 or 304 to turn on, and the turn off voltage level causes the IGBT 302 or 304 to turn off. Similarly, in the case if a BIGT 402 or 404, the turn on voltage level enables forward conducting mode of the BIGT 402 or 404, and the turn off voltage level disables forward conducting mode of the BIGT 402 or 404.

As discussed above in relation to FIG. 5, the drive circuit may also be configured to disable forward conducting mode of the switch module depending on the polarity of the current in the switch module. For example, forward conducting mode may be disabled if the polarity of the current indicates that the switch module is operating in reverse conduction mode. For the lower switch module, a negative current polarity corresponds to current in the direction from the lower rail 312 to the phase output 318. For the upper switch module, a negative current polarity corresponds to current in the direction from the phase output 318 to the upper rail 310. In both cases, negative current polarity indicates that the switch module is operating in reverse conduction mode. As shown, in FIG. 6, when the polarity of the current in the switch module indicates that the switch module is operating in reverse conduction mode, the gate voltage is maintained at the turn off level, thus disabling forward conducting mode of the switch module. In the case of an IGBT module, maintaining the gate voltage at the turn off level, keeps the IGBT switched off, thus avoiding intra module commutation, for example, between the lower IGBT 302 and the lower diode 308 due to spurious triggering of the upper IGBT 302. In the case of a BIGT switch module 402 or 404, maintaining the gate voltage at the turn off level, disables forward conducting mode of the BIGT module and enables the BIGT module to operate more efficiently in reverse conduction mode.

FIG. 6 also shows a change-over phase 610, wherein the switch module transitions between reverse conduction mode operation and forward conducting mode within a single control pulse from the control circuit 316. If the switch module is operating in reverse conduction mode when the control circuit 316 commands the drive circuit to enable forward conducting mode, the gate driver 314 will nevertheless maintain the gate voltage at turn off level, to disable forward conducting mode of the switch module. If the drive circuit subsequently detects that the switch module is no longer operating in reverse conduction mode, the drive circuit may then enable forward conducting mode of the switch module in accordance with the signal from the control circuit 316. In embodiments, the drive circuit may be configured to detect the reverse conduction mode operation of the switch module within the interlock time employed by the control circuit 316. Exemplary drive circuits for implementing the switching scheme of FIG. 6 are described below in reference to FIGS. 7 and 8.

Figure 7:
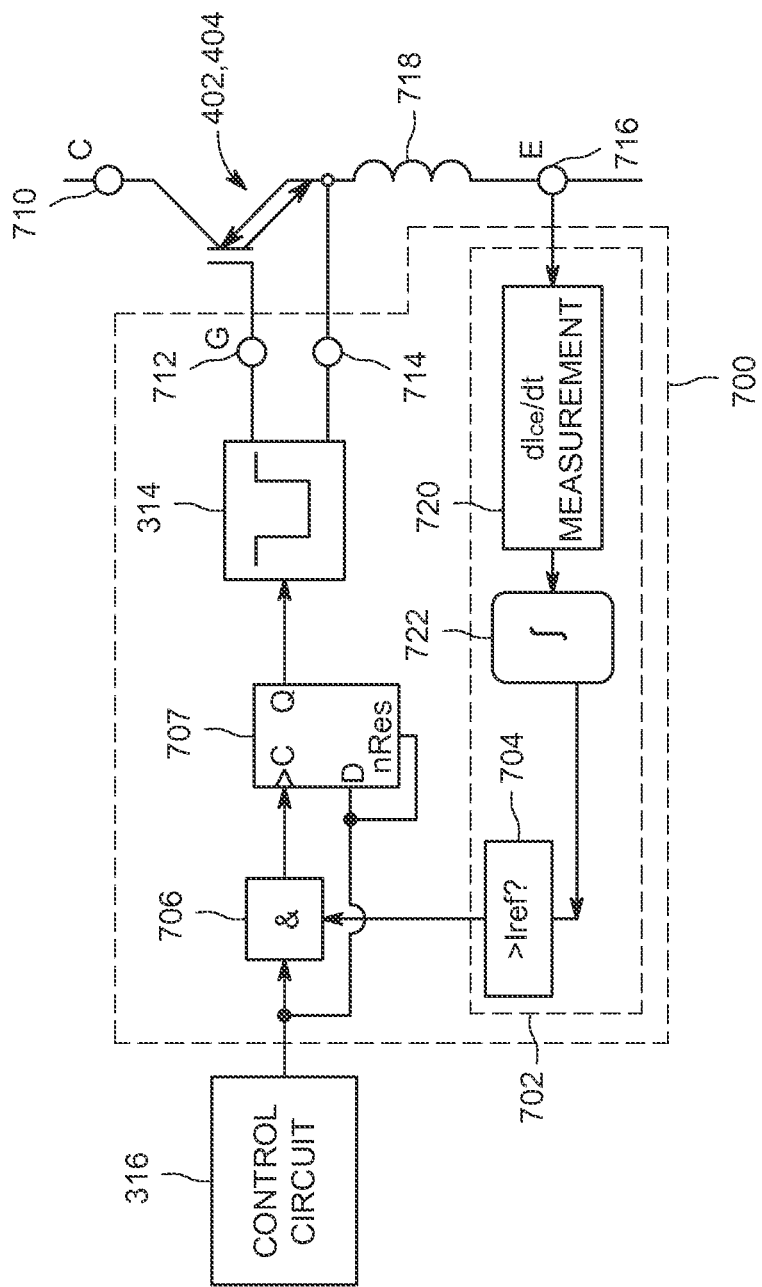
FIG. 7 is a block diagram of an example of a drive circuit in accordance with embodiments.

FIG. 7 is a block diagram of an example of a drive circuit in accordance with embodiments. The exemplary drive circuit shown in FIG. 7 can be used to implement the switching scheme shown in FIG. 5. Although FIG. 7 shows a drive circuit 700 for a BIGT module, it will be appreciated that the drive circuit shown in FIG. 7 can also be used with any other type of switch module, such as an IGBT, reverse conducting IGBT, and the like. Further, although one drive circuit 700 is shown, it will be appreciated that each switch module of an inverter may include its own dedicated drive circuit 700.

As shown in FIG. 7, the drive circuit 700 may implement the switching scheme of FIG. 5 or of FIG. 6 using a sense circuit 702, along with an AND-gate 706, a flip-flop 707, and a gate driver 314. The sense circuit 702 is configured to estimate the collector-emitter current, Ice, through the BIGT 402 or 404. The BIGT 402 or 404 may be coupled to a set of terminals, including a collector terminal 710, gate terminal 712, and emitter terminals 714 and 716. The first emitter terminal 714 is referred to as a control terminal and enables the gate driver 314 to be coupled across the gate and the emitter of the BIGT. The second emitter terminal 716 is referred to as a power terminal and enables the BIGT emitter to be coupled to the rest of the circuitry in the inverter, for example, either the lower rail 312 or the phase output 318 (FIG. 4). Between the first emitter terminal 714 and the second emitter terminal 716 is a conductor with a parasitic inductance, as indicated by an inductor 718.

In an embodiment, the sense circuit 702 is a current sensing circuit that includes a voltage sensor 720 for measuring the voltage between the first emitter terminal 714 and the second emitter terminal 716, and an integrator 722 to determine an estimate of the collector-emitter current based on the measured voltage. Due to the parasitic inductance 718, the voltage between the first emitter terminal 714 and the second emitter terminal 716 may be approximately equal to the instantaneous rate of change in the emitter-collector current, dIce/dt. Thus, the emitter-collector current can be estimated by integrating the voltage measured using the integrator 722.

The output of the integrator 722 is an estimate of the collector-emitter current in the BIGT 402 or 404. The output of the integrator 722 can be coupled to the comparator 704, which may determine whether the estimated current is greater than a reference current, Iref. In an embodiment, the reference current, Iref, may be zero, so that the output of the comparator 704 is directly related to the polarity of the estimated collector-emitter current. For example, if the estimated collector-emitter current is positive, meaning that the BIGT 402 or 404 is operating in forward conducting mode, the output of the comparator 704 may be set to logical one (HIGH signal). If the estimated collector-emitter current is negative, meaning that the BIGT 402 or 404 is operating in reverse conduction mode, the output of the comparator 704 may be set to logical zero (LOW signal).

The output of the comparator 704 and the output of the control circuit 316 may be coupled to the input of the AND-gate 706. The output of the AND-gate is coupled to a clock terminal C of the flip-flop 707, which is configured as a delay flip-flop. The output of the control circuit 316 also is coupled to a data terminal D of the delay flip-flop 707, and to a reset terminal Res of the delay flip-flop 707. The delay flip-flop 707 has a specially configured reset terminal, such that a high signal to the reset terminal holds the present state of the flip-flop, whereas a low signal to the reset terminal resets the flip-flop to zero state. In FIG. 7, the reset terminal is marked "nRes" to indicate it is an "Active-LOW" terminal that will, on receipt of a LOW signal, reset the delay flip-flop 707 to remember and continuously output a LOW value. The delay flip-flop 707 has its output Q coupled to the input of the gate driver 314. Accordingly, only when the control circuit 316 commands the BIGT 402 or 404 to turn on, while the estimated collector-emitter current in the BIGT 402 or 404 indicates that the BIGT 402 or 404 is not operating in reverse conduction mode, the AND-gate 706 will output a clock signal to the clock terminal C of the delay flip-flop 707. The clock signal will trigger the clock terminal C to cause the delay flip-flop 707 to accept and latch a forward-enable command received from the control circuit 316 at the data terminal D. On the other hand, without receiving the clock signal at the clock terminal C, the delay flip-flop 707 would simply ignore the forward-enable command at the data terminal D.

Once the delay flip-flop 707 has accepted and latched the forward-enable command, it will continue to send the latched forward-enable command from its output Q to the gate driver circuit 314, maintaining the power switch element in a forward conducting mode, until the control circuit 316 sends a turn off (logical low) command. Thus, even in case the comparator 704 might indicate a reverse-conducting condition in the switch module, the delay flip-flop 707 will continue to send the forward-enable command to the gate driver circuit 314, so that while forward conducting mode is enabled the drive circuit 700 will ignore indications of reverse conduction. However, as soon as the control circuit 316 sends a turn off (logical low) command, receipt of that low signal will trigger the specially configured reset terminal nRes of the delay flip-flop 707, and will cause the delay flip-flop to stop sending the forward-enable command from output Q to the gate driver 314. The delay flip-flop 707 then will latch and will continue to not send the forward-enable command, until the turn-on command from the control circuit 316 again coincides with an indication from the comparator 704 that the BIGT 402 or 404 is not reverse-conducting.

As noted above, the same drive circuit could be used, for example, in an IGBT inverter, in which case, the BIGT 402 or 404 would be replaced by a switch module that includes an IGBT 302 or 304 and anti-parallel diode 306 or 308. Similar to the BIGT inverter, the gate driver 314 will receive a command to turn on the IGBT 302 or 304 if the control circuit 316 is commanding the IGBT 302 or 304 to turn on and the estimate collector-emitter current in the IGBT switch module indicates the that diode 306 or 308 of the switch module is not conducting.

Figure 8:
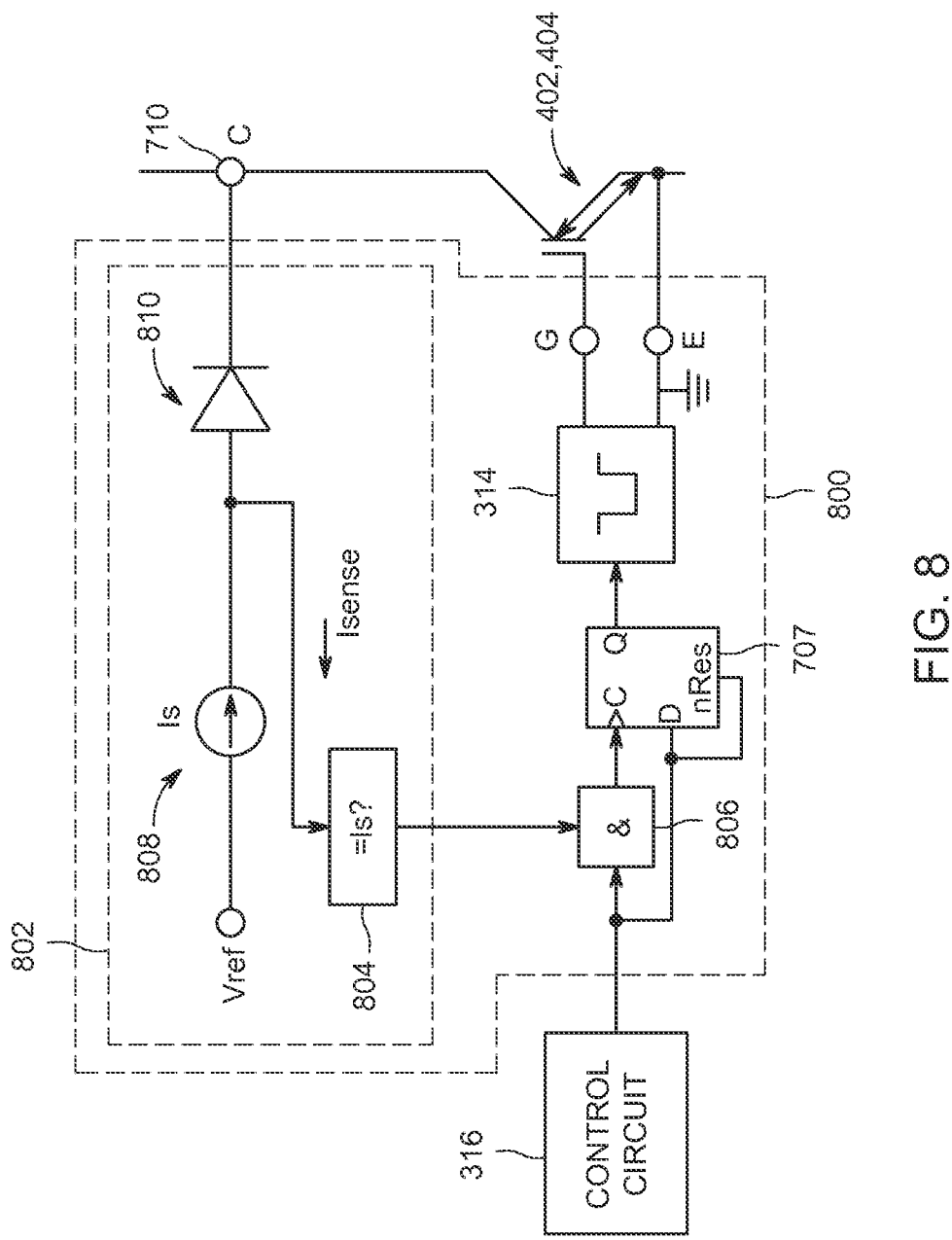
FIG. 8 is a block diagram of an example of a drive circuit in accordance with embodiments.

FIG. 8 is a block diagram of a drive circuit in accordance with embodiments. The exemplary drive circuit shown in FIG. 8 can be used to implement the switching scheme shown in FIG. 5. Further, although a BIGT 402 or 404 is shown, it will be appreciated that the drive circuit shown in FIG. 8 can also be used with any type of switch module, such as an IGBT, reverse conducting IGBT, and the like. Further, although one drive circuit 800 is shown, it will be appreciated that each switch module of an inverter may include its own dedicated drive circuit 800.

As shown in FIG. 8, the drive circuit 800 may implement the switching scheme of FIG. 5 or of FIG. 6 using a sense circuit 802, an AND-gate 806, a flip-flop 707, and a gate driver 314. The sense circuit 802 is configured as a voltage sensing circuit to detect the voltage level across the power terminals, Vce, across the BIGT 402 or 404. The sense circuit 802 includes a comparator 804 for comparing the detected voltage level to a reference level Vref. At least two different voltage levels can be detected, e.g., Vce above or below Vref. In some embodiments, the voltage sensor can include a current source 808. The output of the current source 808 may be coupled to a collector terminal 710 of the BIGT 402 or 404 through a diode 810 and also to the input of the comparator 804. The input to the current source may be coupled to the reference voltage, Vref, which may be approximately 0 Volts. In some embodiments, the voltage sensor can include a voltage divider with a following comparator or analog digital converter stage.

Depending on the voltage to emitter at the collector terminal 710, the current from the current source 808 will follow a path through the diode 810 to the collector terminal 710 or to the comparator 804. The current input to the comparator is referred to as the sense current, Isense. When the BIGT 402 or 404 is operating in reverse conduction mode, the voltage at the collector terminal 710, Vc, will be negative. The negative voltage at the collector terminal 710 forward biases the diode 810 so that the source current, Is, follows a path through the diode 810 to the collector terminal 710 and Isense will be at or close to zero. When the BIGT 402 or 404 is operating in forward conducting mode or blocking mode, the voltage at the collector terminal 710, Vc, will be positive. The positive voltage at the collector terminal 710 negatively biases the diode 810 such that the source current, Is, is conducted to the comparator 804 and Isense equals a non-zero number approximately equal to the source current. To summarize, the input to the comparator will be less than the source current, Is, when operating in reverse conduction mode and approximately equal to the source current when operating in forward conducting mode or blocking mode.

The comparator 804 may compare the input current to the source current, Is, which may be a known value that can be determined based on the design considerations for a particular circuit. If the input current equals the source current (forward conducting mode), the comparator 804 may enable the forward conducting mode by, for example, sending a logic one or HIGH signal to the AND-gate. If the input current is less than the source current (reverse conduction mode), the comparator 804 may disable the forward conducting mode by, for example, sending a logic zero or LOW signal to the AND-gate. The control circuit 316, the comparator 804, the AND-gate 806, the flip-flop 707, and the gate driver 314 are networked in a similar way and to similar effect as discussed above with reference to FIG. 7.

Figure 9:
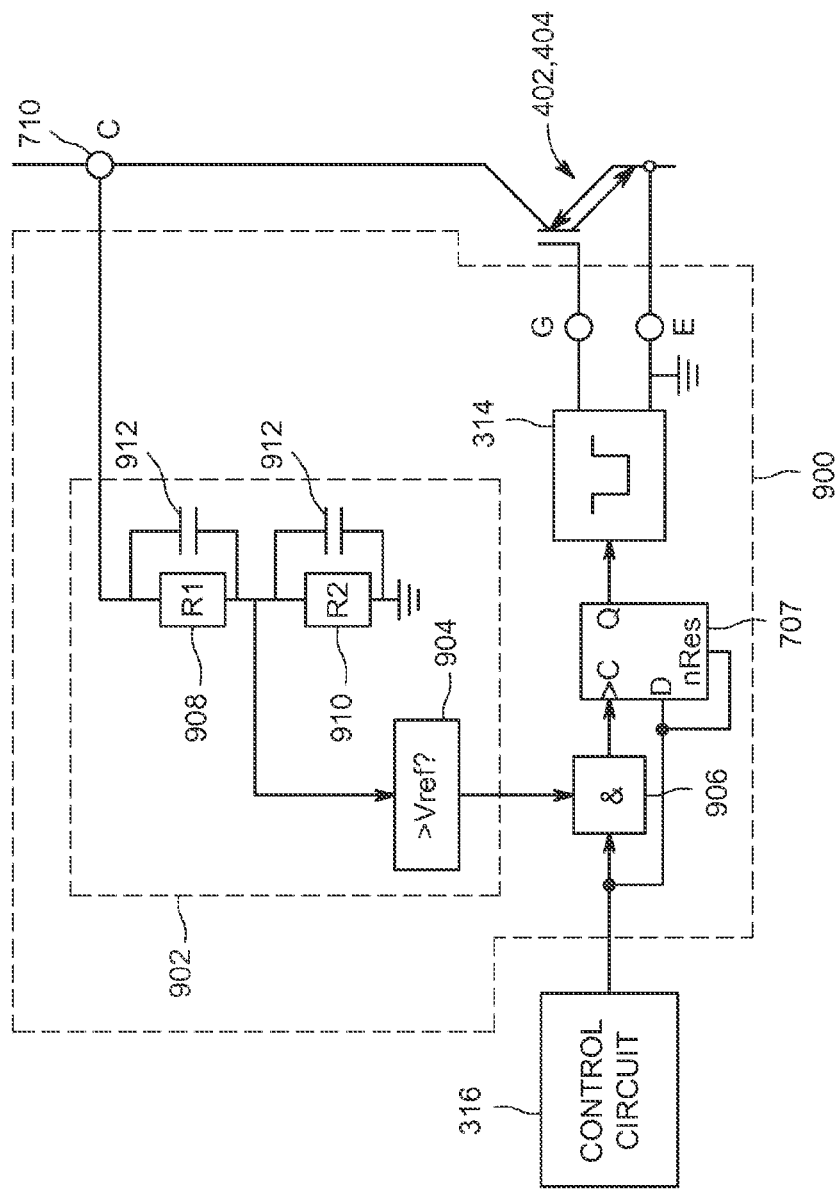
FIG. 9 is a block diagram of an example of a drive circuit in accordance with embodiments

FIG. 9 is a block diagram of a drive circuit in accordance with embodiments. The exemplary drive circuit shown in FIG. 9 can be used to implement the switching scheme shown in FIG. 5. Further, although a BIGT 402 or 404 is shown, it will be appreciated that the drive circuit shown in FIG. 9 can also be used with any type of switch module, such as an IGBT, reverse conducting IGBT, and the like. Further, although one drive circuit 900 is shown, it will be appreciated that each switch module of an inverter may include its own dedicated drive circuit 900.

As shown in FIG. 9, the drive circuit 900 may implement the switching scheme of FIG. 5 or of FIG. 6 using a sense circuit 902, an AND-gate 906, a flip-flop 707, and a gate driver 314. The sense circuit 902 is configured as a voltage divider to detect the voltage level across the power terminals, Vice, across the BIGT 402 or 404. At least two different voltage levels can be detected using a comparator 904. In some embodiments, the voltage divider 902 includes a pair of resistors, R1 908 and R2 910, coupled in series. In an embodiment, capacitors 912 can be disposed in parallel with the resistors 908 and 910 to optimize the dynamic response of the voltage divider 902. The output of the voltage divider 902 may be coupled to the input of the comparator 904 that compares the voltage level across the lower resistor R2 910 to a voltage reference Vref, which may be approximately 0 Volts. When the BIGT 402 or 404 is operating in reverse conduction mode, the voltage at the collector terminal 710, Vc, will be negative and the voltage level across the lower resistor R2 910 will be lower than the voltage reference. When the BIGT 402 or 404 is operating in forward conducting mode or blocking mode, the voltage at the collector terminal 710, Vc, will be positive and the voltage level across the lower resistor R2 910 will be greater than the voltage reference.

If the voltage level across the lower resistor R2 910 is greater than the voltage reference, the comparator 804 may enable the forward conducting mode by, for example, sending a logic one or HIGH signal to the AND-gate. If the voltage level across the lower resistor R2 910 is lower than the voltage reference (reverse conduction mode), the comparator 804 may disable the forward conducting mode by, for example, sending a logic zero or LOW signal to the AND-gate. The control circuit 316, the comparator 904, the AND-gate 906, the flip-flop 707, and the gate driver 314 are networked in a similar way and to similar effect as discussed above with reference to FIG. 7.

Figure 10:
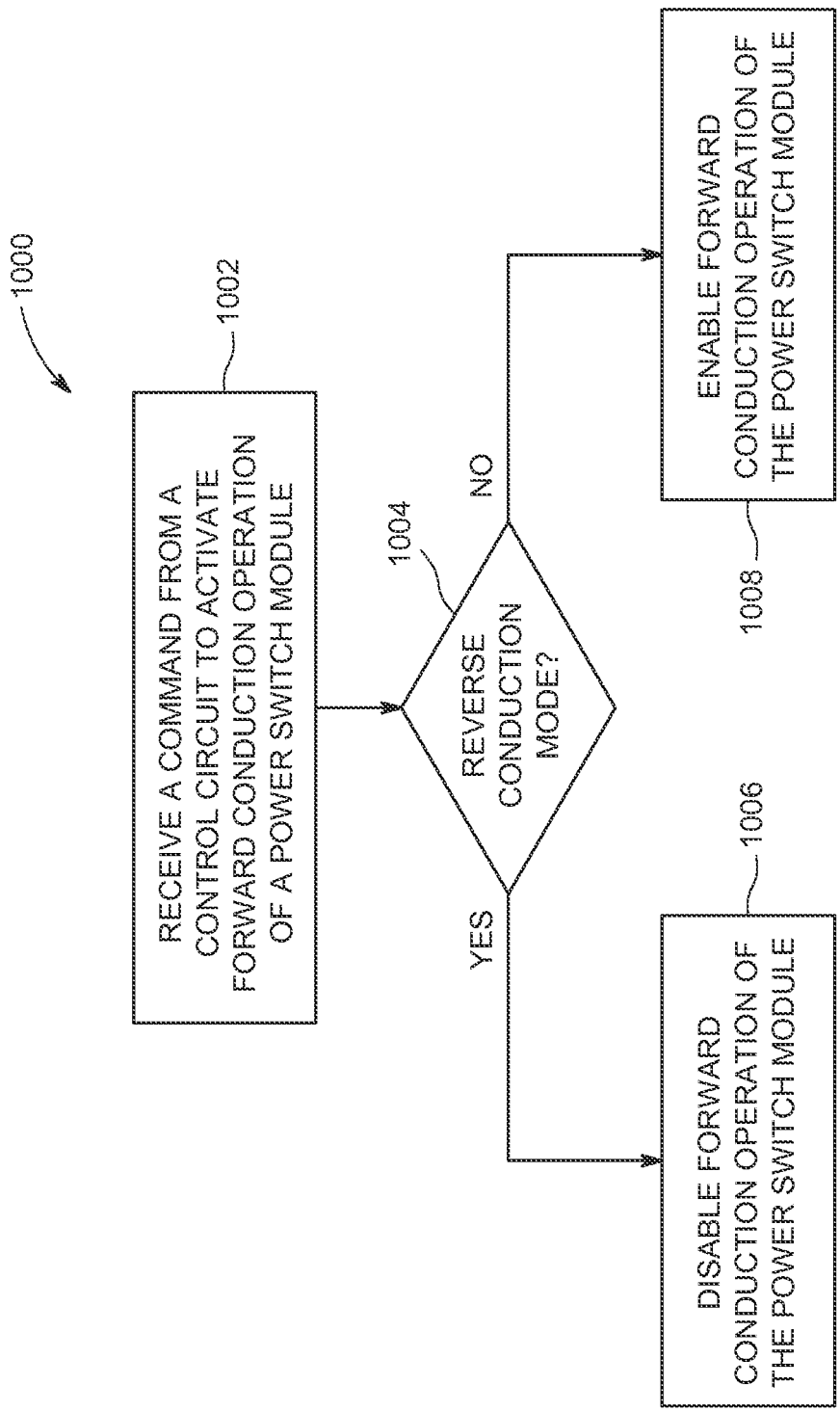
FIG. 10 is a process flow diagram summarizing a method of operating an inverter module in accordance with embodiments.

FIG. 10 is a process flow diagram summarizing a method of operating an inverter module in accordance with embodiments. The method 1000 may implemented by a drive circuit coupled to a switch module, such as the drive circuits 700 and 800 of FIGS. 7 and 8. At block 1002, a command to enable a forward conducting mode of a switch module may be received from a control circuit.

At block 1004, a determination may be made regarding whether the switch module is operating in reverse conduction mode. In embodiments, determining whether the switch module is operating in reverse conduction mode includes determining a polarity of current through the power terminals of the switch module. For example, determining whether the switch module is operating in reverse conduction mode may include measuring a voltage across a parasitic inductance between a first emitter terminal and a second emitter terminal and integrating the voltage to estimate the current through the emitter terminal. In another example, determining whether the switch module is operating in reverse conduction mode includes detecting the voltage level across the power terminals of the switch module.

If, at block 1004, the switch module is operating in reverse conduction mode, the process flow may advance to block 1006 and the forward conducting mode of the switch module may be disabled. Accordingly, forward conducting mode of the switch module is disabled when the polarity of the current is negative in a direction from the collector terminal to the emitter terminal.

If, at block 1004, the switch module is not operating in reverse conduction mode, the process flow may advance to block 1008 and the forward conducting mode of the switch module may be enabled. Accordingly, the forward conducting mode of the switch module will only be activated if the control circuit is commanding the activation of the forward conducting mode and the forward conducting mode is not disabled.

Figure 11:
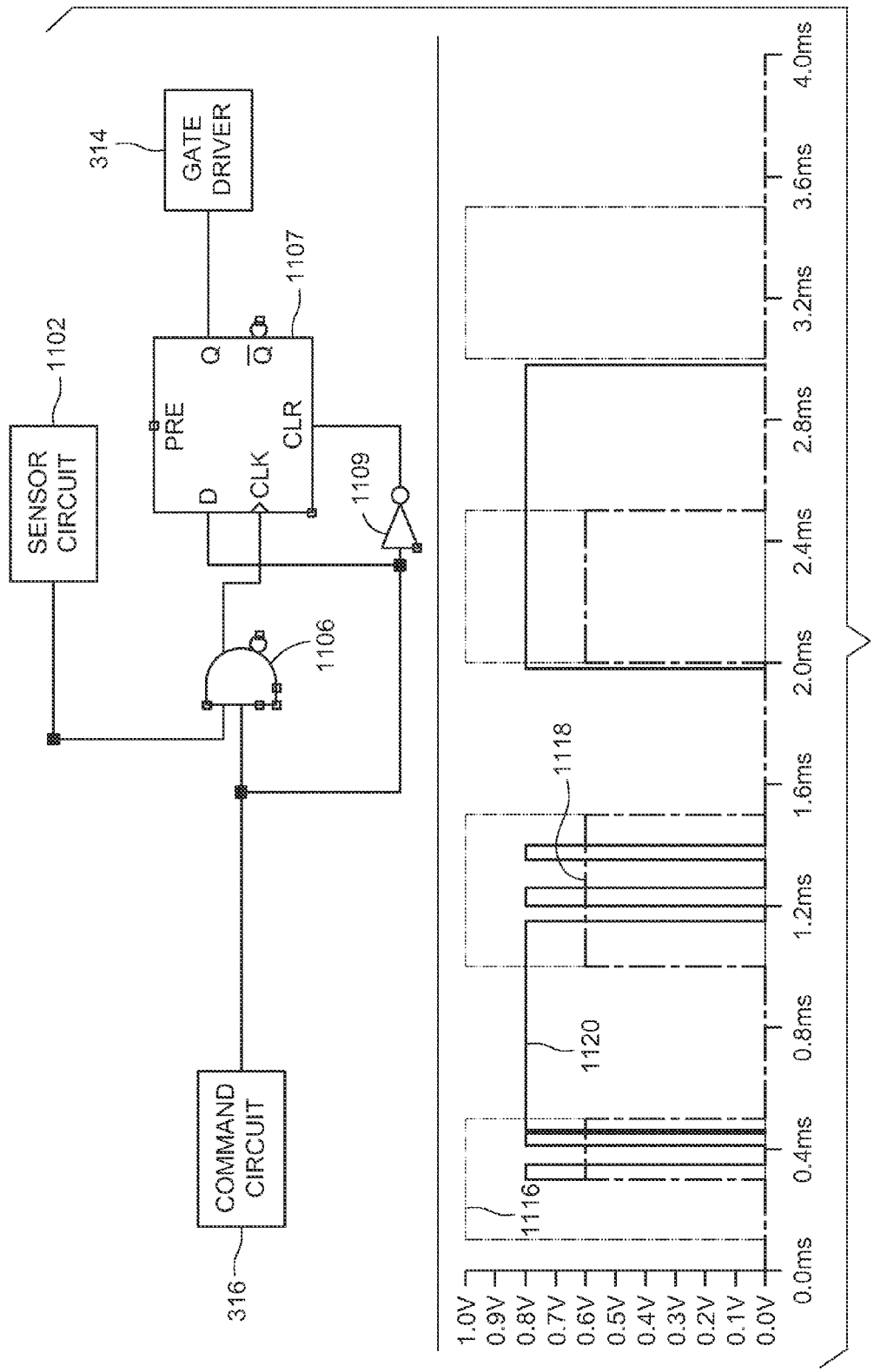
FIG. 11 is a block diagram of a drive circuit in accordance with embodiments.

FIG. 11 is a block diagram of a drive circuit in accordance with embodiments. The exemplary drive circuit shown in FIG. 11 can be used to implement the switching schemes shown in FIG. 5 or 6. Although one drive circuit 1100 is shown, it will be appreciated that each switch module of an inverter may include its own dedicated drive circuit 1100. As shown in FIG. 11, the drive circuit 1100 may implement the switching scheme of FIG. 5 or of FIG. 6 using a sense circuit 1102, which is connected via an AND gate 1106 and a 1107 flip-flop to the gate driver 314, in a manner generally similar to any of the various sense circuits as discussed above with reference to FIGS. 7-9.

When the sense circuit 1102 detects reverse conduction mode of a switch element (e.g., a BIGT 402 or 404 as shown in preceding figures), then the sense circuit may disable forward conducting mode of the drive circuit 1100 by, for example, sending a logic zero or LOW signal to the AND-gate 1106, thereby isolating the control circuit 316 from sending a HIGH signal to the CLK terminal of the delay flip-flop 1107. On the other hand, when the sense circuit 1102 does not detect reverse conduction, then it may enable forward conducting mode by, for example, sending a logic one or HIGH signal to the AND-gate 1106, thereby permitting the control circuit 316 to send a HIGH signal to the CLK terminal of the delay flip-flop 1107. Thus, in case the control circuit 316 provides a command signal, while the sense circuit 1102 detects that the switch element driven by the drive circuit 1100 is not reverse-conducting, then the delay flip-flop 1107 will set its output Q to a logic one (HIGH signal), enabling the gate driver 314 to an ON state.

The delay flip-flop 1107 differs from the delay flip-flop 707 at least in that the delay flip-flop 1107 has an active HIGH terminal CLR, which on receipt of a logic one or HIGH signal, sets the delay flip-flop output Q to logic zero, thereby disabling the gate driver 314. Accordingly a NOT gate 1109 is provided between the control circuit 316 and the CLR terminal of the delay flip-flop 1107. At any time that the control circuit 316 provides a LOW signal, the NOT gate actuates the CLR terminal of the delay flip-flop 1107 and causes the delay flip-flop 1107 to send a LOW output Q to the gate driver 314.

FIG. 11 also illustrates a mode of operation of the drive circuit 1100, in which a command signal 1116 from the control circuit 316 can cause the gate driver 314 to produce a gate signal 1118, beginning as soon as the sense circuit 1102 provides an indication 1120 that the BIGT 402 or 404 is not reverse conducting, and continuing until the command signal 1116 terminates, regardless whether the indication 1120 is interrupted during production of the gate signal 1118.

Referring to the embodiments discussed above, the general behavior of those embodiments is that, once forward conducting mode of a switch element has been established, the various drive circuits work to maintain enablement of the forward conducting mode until cessation of a forward conducting mode enable signal sent from the command circuit 316, despite indications of reverse conduction mode from the various sense circuits. However, under certain operating conditions it may be desirable to provide a circuit that further assesses the system operation before determining whether to ignore or act upon a sense circuit indication of reverse conduction mode. For example, a system of switch elements may be set up such that the system as a whole alternately trends toward a first condition where a particular switch element may be expected to be in reverse conduction mode, or toward a second condition where the same particular switch element may be expected to not be in reverse conduction mode. In case the system as a whole trends toward the first condition, it will be desirable for a drive circuit to acknowledge and act upon sense circuit indications of reverse conduction mode, i.e., disable forward conducting mode even in case it already is established. On the other hand, in case the system as a whole trends toward the second condition, it will be desirable for a drive circuit to ignore sense circuit indications of reverse conduction mode, i.e., maintain enablement of the forward conducting mode in case it already is established, just as in the drive circuits discussed above.

Figure 12:
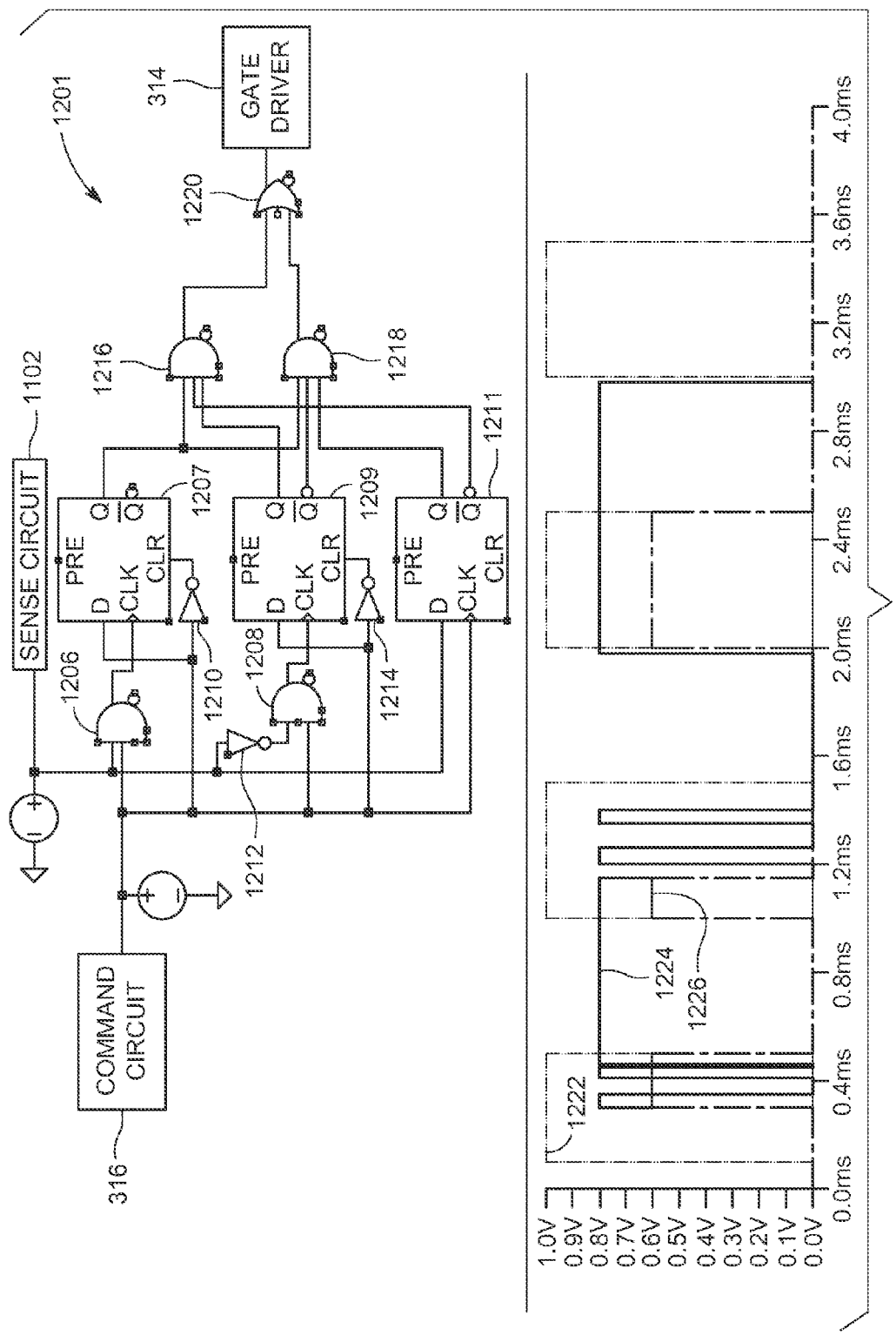
FIG. 12 is a block diagram of a drive circuit in accordance with embodiments.

Therefore, FIG. 12 is a block diagram of a drive circuit in accordance with embodiments. The exemplary drive circuit shown in FIG. 12 can be used to implement the switching schemes shown in FIG. 5 or 6. Although one drive circuit 1200 is shown, it will be appreciated that each switch module of an inverter may include its own dedicated drive circuit 1200. As shown in FIG. 12, the drive circuit 1200 may implement the switching scheme of FIG. 5 or of FIG. 6 using a sense circuit 1202, which is connected to the gate driver 314 via a logic network 1201 that comprises preliminary AND gates 1206, 1208, NOT gates 1210, 1212, 1214, delay flip-flops 1207, 1209, 1211, output AND gates 1216, 1218, and an output OR gate 1220. The sense circuit 1202 may be any of the various types of sense circuits discussed above with reference to preceding drawing figures. Each of the delay flip-flops 1207, 1209, 1211 is substantially similar to the delay flip-flop 1107, e.g., each of the delay flip-flops in the exemplary drive circuit 1200 has an active HIGH terminal CLR for setting the output Q to logic zero. The delay flip-flops 1207, 1209, 1211 have their outputs Q respectively connected to inputs of the output AND gates 1216 and 1218, 1216, and 1218. The delay flip-flops 1209 and 1211 have their inverted outputs Q respectively connected to inputs of the output AND gates 1218 and 1216.

While the sense circuit 1202 detects reverse conduction mode of a switch element (e.g., a BIGT 402 or 404 as shown in preceding figures), then the sense circuit may disable the drive circuit 1200 from initiating forward conducting mode of the gate driver 314. For example, the sense circuit 1202 may send a logic zero or LOW signal to the AND-gate 1206, the NOT gate 1212, and the D terminal of the delay flip-flop 1211.

The logic network 1201, and in particular the interconnections of the three-input AND gates 1216, 1218 with the three delay flip-flops 1207, 1209, 1211, enables the drive circuit 1200 to operate in a manner somewhat more complex than other embodiments. Thus, FIG. 12 also illustrates two possible modes of operation of the drive circuit 1200. In a first mode of operation, when the drive circuit 1200 first receives from the control circuit 316 a forward conducting mode enable command signal 1222, and subsequently receives from the sense circuit 1202 an indication 1224 that the BIGT 402 or 404 is not reverse conducting, then the drive circuit 1200 causes the gate driver 314 to produce a gate signal 1226, continuing until the forward conducting mode enable command signal 1222 terminates, regardless whether the indication 1224 is interrupted during production of the gate signal 1226. In a second mode of operation, when the drive circuit 1200 first receives from the sense circuit 1202 the indication 1224 that the BIGT 402 or 404 is not reverse conducting, and subsequently receives from the control circuit 316 the forward conducting mode enable command signal 1222, then the drive circuit causes the gate driver 314 to produce the gate signal 1226, continuing only until the earlier of when the forward conducting mode enable command signal 1222 terminates or when the indication 1224 terminates.

In embodiments, an apparatus includes a switch module; a sense circuit coupled to the switch module and configured to indicate an operating conduction mode of the switch module; and a drive circuit operatively coupled to the switch module to enable and disable forward conducting mode of the switch module. Once the switch module is in forward conducting mode, the drive circuit is configured to maintain enablement of the switch module in the forward conducting mode even if the sense circuit indicates that the switch module is operating in a reverse conduction mode. In certain embodiments, the apparatus includes an insulated gate bipolar transistor (IGBT) and a diode disposed in anti-parallel with the IGBT. In certain embodiments, the apparatus includes a BIGT. In certain embodiments, the drive circuit is configured to determine whether the switch module is operating in reverse conduction mode within an interlock time. In certain embodiments, the sense circuit includes a current sense circuitry configured to determine a polarity of the current flowing through the power terminals of the switch module, and configured to determine whether the switch module is operating in reverse conduction mode based on the polarity of the switch module current. In certain embodiments, the current sense circuitry is configured to provide a current estimation by measuring a voltage across a parasitic inductance disposed between a control or sensing terminal of the switch module and a power terminal of the switch module. In certain embodiments, the sense circuit includes a voltage sense circuitry configured to determine a voltage polarity across power terminals of the switch module, wherein the sense circuit is configured to determine whether the switch module is operating in reverse conduction mode based on the voltage polarity. In certain embodiments, the voltage sense circuitry includes a current source coupled to a collector terminal of the switch module through a diode, wherein an output of the voltage sense circuitry is responsive to a voltage of the collector terminal. In certain embodiments, the voltage sense circuitry includes a voltage divider circuit with a following comparator or analog digital converter. In certain embodiments, the drive circuit includes an AND-gate configured to receive a first input from a control circuit configured to activate forward conducting mode of the switch module; and a second input configured to enable or disable forward conducting mode of the switch module based on an output of the sense circuit, wherein an output of the AND-gate controls an input of a gate driver of the switch module. For example, the output of the AND-gate may be coupled to a clock terminal of a delay flip-flop, with a data terminal of the delay flip-flop connected to receive the first input from the control circuit, the delay flip-flop configured to latch the first input from the control circuit from activation of the clock terminal until the control circuit sends a signal to disable forward conducting mode, and an output of the delay flip-flop coupled to the input of the gate driver of the switch module.

In other embodiments, a system includes a first switch module coupled to a DC rail voltage and configured to switch on and off in an alternation with a second switch module to produce an output AC waveform; a drive circuit operatively coupled to the first switch module and configured to enable and disable a forward conducting mode of the first switch module; and a sense circuit configured to determine an operating conduction mode of the first switch module. Once the switch module is in forward conducting mode, the drive circuit is configured to maintain enablement of the first switch module in the forward conducting mode even if the sense circuit indicates the first switch module is operating in a reverse conduction mode. In certain embodiments, the first switch module comprises an insulated gate bipolar transistor (IGBT) and a diode disposed in anti-parallel with the IGBT. In certain embodiments, the first switch module includes a BIGT. In certain embodiments, the drive circuit is configured to determine whether the first switch module is operating in the reverse conduction mode within an interlock time, between switching off the second switch module and switching on the first switch module, that is imposed by a control circuit coupled to the drive circuit. In certain embodiments, the sense circuit includes a current sense circuitry configured to determine a polarity of a current flowing through the first switch module, wherein the sense circuit is configured to determine whether the first switch module is operating in reverse conduction mode based on the polarity of the current. In certain embodiments, the current sense circuitry provides a current estimation by measuring a voltage across a parasitic inductance disposed between a control terminal and a power terminal of the power electronic module. For example, the sense circuit comprises a voltage sense circuitry configured to determine the voltage polarity across the power terminals of the switch module, wherein determining whether the switch module is operating in reverse conduction mode comprises determining the polarity of the voltage across the power terminals of the switch module. Or, as another example, the voltage sense circuitry includes a current source coupled to a collector terminal of the first switch module through a diode, wherein an output of the voltage sense circuitry is responsive to a voltage of the collector terminal. Or, as another example, the voltage sense circuitry includes a voltage divider circuit with a following comparator or analog digital converter. In certain embodiments, the drive circuit includes an AND-gate configured to receive a first input from a control circuit configured to activate forward conducting mode of the switch module; and a second input configured to enable or disable forward conducting mode of the switch module based on an output of the sense circuit, wherein an output of the AND-gate controls an input of a gate driver of the switch module. In certain embodiments, the output of the AND-gate is coupled to a clock terminal of a delay flip-flop, a data terminal of the delay flip-flop is connected to receive the first input from the control circuit, the delay flip-flop is configured to latch the first input from the control circuit from activation of its clock terminal until the control circuit sends a signal to disable forward conducting mode, and an output of the delay flip-flop is coupled to the input of the gate driver of the switch module.

Other aspects provide a method, which includes determining if a switch module is operating in a reverse conduction mode; ignoring a command to enable forward conducting mode of the switch module, in the event that the switch module is operating in the reverse conduction mode; accepting the command to enable forward conducting mode of the switch module, in the event that the switch module is not operating in the reverse conduction mode; and ignoring indications that the switch module is operating in reverse conduction mode during a time between receipt of the command to enable the forward conducting mode and receipt of a command to disable the forward conducting mode.

Other embodiments provide a power electronic module that includes a switch module; a sense circuit coupled to the switch module and configured to indicate an operating conduction mode of the switch module; and a drive circuit operatively coupled to the switch module and configured to enable a forward conducting mode of the switch module in response to receiving a forward mode enable command while the sense circuit does not indicate a reverse conduction mode. Once the switch module is in forward conducting mode, the drive circuit is configured to maintain the forward conducting mode of the switch module even if the sense circuit indicates the reverse conduction mode, unless the drive circuit enabled forward conducting mode in response to initial receipt of a forward mode enable command at a time while the sense circuit did not indicate a reverse conduction mode.

It is to be understood that the above description is intended to be illustrative, and not restrictive. For example, other means of sensing current in the switch could be employed, such as a shunt or a giant magnetoresistive device. As another example, although the various drive circuits are shown as simply passing on or interrupting a command signal for causing a gate driver to supply or withhold gate voltage, equivalent drive circuits might receive a variety of command signals that cause those drive circuits to enable or disable a gate driver, e.g., a first command signal for turning the gate driver on and a second command signal for turning the gate driver off. Also, the above-described embodiments (and/or aspects thereof) may be used in combination with each other. In addition, many modifications may be made to adapt a particular situation or material to the teachings of the invention without departing from its scope. While the dimensions and types of materials described herein are intended to illustrate embodiments of the invention, they are by no means limiting and are exemplary in nature. Other embodiments may be apparent upon reviewing the above description. The scope of the invention should, therefore, be determined with reference to the appended claims, along with the full scope of equivalents to which such claims are entitled.

In the appended claims, the terms "including" and "in which" are used as the plain-English equivalents of the respective terms "comprising" and "wherein." Moreover, in the following claims, the terms "first," "second," "3$^{rd}$," "upper," "lower," "bottom," "top," "up," "down," etc. are used merely as labels, and are not intended to impose numerical or positional requirements on their objects. Further, the limitations of the following claims are not written in means-plus-function format and are not intended to be interpreted based on 35 U.S.C. §122, sixth paragraph, unless and until such claim limitations expressly use the phrase "means for" followed by a statement of function void of further structure.

As used herein, an element or step recited in the singular and proceeded with the word "a" or "an" should be understood as not excluding plural of said elements or steps, unless such exclusion is explicitly stated. Furthermore, references to "one embodiment" of the invention are not intended to be interpreted as excluding the existence of additional embodiments that also incorporate the recited features. Moreover, unless explicitly stated to the contrary, embodiments "comprising," "including," or "having" an element or a plurality of elements having a particular property may include additional such elements not having that property.

Since certain changes may be made in the above-described embodiments, without departing from the spirit and scope of the invention herein involved, it is intended that all of the subject matter of the above description or shown in the accompanying drawings shall be interpreted merely as examples illustrating the inventive concept herein and shall not be construed as limiting the invention.

What is claimed is:

1. An apparatus comprising:
   a switch module;
   a sense circuit coupled to the switch module and configured to indicate an operating conduction mode of the switch module; and
   a drive circuit operatively coupled to the switch module to enable and disable a forward conducting mode of the switch module;
   wherein once the switch module is operating in the forward conducting mode, the drive circuit is configured to maintain enablement of the switch module in the forward conducting mode even if the sense circuit indicates that the switch module is operating in a reverse conduction mode;
   wherein the drive circuit comprises a delay flip-flop and an AND-gate, the AND-gate configured to receive: a first input from a control circuit configured to activate the forward conducting mode of the switch module; and a second input configured to enable or disable the forward conducting mode of the switch module based on an output of the sense circuit, wherein an output of the AND-gate controls an input of a gate driver of the switch module; and
   wherein the output of the AND-gate is coupled to a clock terminal of the delay flip-flop, a data terminal of the delay flip-flop is connected to receive the first input from the control circuit, the delay flip-flop is configured to latch the first input from the control circuit from activation of the clock terminal until the control circuit sends a signal to disable the forward conducting mode, and an output of the delay flip-flop is coupled to the input of the gate driver of the switch module.

2. The apparatus of claim 1, wherein the switch module comprises an IGBT and a diode disposed in anti-parallel with the IGBT.

3. The apparatus of claim 1, wherein the switch module comprises a BIGT.

4. The apparatus of claim 1, wherein the drive circuit is configured to determine whether the switch module is operating in the reverse conduction mode within an interlock time.

5. The apparatus of claim 1, wherein the sense circuit comprises a current sense circuitry configured to determine a polarity of a current flowing through power terminals of the switch module, and wherein the sense circuit is configured to determine whether the switch module is operating in the reverse conduction mode based on the polarity of the switch module current.

6. The apparatus of claim 5, wherein the current sense circuitry is configured to provide a current estimation by measuring a voltage across a parasitic inductance disposed between a control or sensing terminal of the switch module and one of the power terminals of the switch module.

7. The apparatus of claim 1, wherein the sense circuit comprises a voltage sense circuitry configured to determine a voltage polarity across power terminals of the switch module, and wherein the sense circuit is configured to determine whether the switch module is operating in the reverse conduction mode based on the voltage polarity.

8. The apparatus of claim 7, wherein the voltage sense circuitry comprises a current source coupled to a collector terminal of the switch module through a diode, wherein an output of the voltage sense circuitry is responsive to a voltage of the collector terminal.

9. The apparatus of claim 7, wherein the voltage sense circuitry comprises a voltage divider circuit with a following comparator or analog digital converter.

10. A system comprising:
    a first switch module coupled to a DC rail voltage and configured to switch on and off in an alternation with a second switch module to produce an output AC waveform;

a drive circuit operatively coupled to the first switch module and configured to enable and disable a forward conducting mode of the first switch module; and a sense circuit configured to determine an operating conduction mode of the first switch module;

wherein once the first switch module is operating in the forward conducting mode, the drive circuit is configured to maintain enablement of the first switch module in the forward conducting mode even if the sense circuit indicates the first switch module is operating in a reverse conduction mode;

wherein the drive circuit comprises a delay flip-flop and an AND-gate, the AND-gate configured to receive: a first input from a control circuit configured to activate the forward conducting mode of the first switch module; and a second input configured to enable or disable the forward conducting mode of the first switch module based on an output of the sense circuit, wherein an output of the AND-gate controls an input of a gate driver of the first switch module; and wherein the output of the AND-gate is coupled to a clock terminal of the delay flip-flop, a data terminal of the delay flip-flop is connected to receive the first input from the control circuit, the delay flip-flop is configured to latch the first input from the control circuit from activation of the clock terminal until the control circuit sends a signal to disable the forward conducting mode, and an output of the delay flip-flop is coupled to the input of the gate driver of the first switch module.

11. The system of claim 10, wherein the first switch module comprises an IGBT and a diode disposed in antiparallel with the IGBT.

12. The system of claim 10, wherein the first switch module comprises a BIGT.

13. The system of claim 10, wherein the drive circuit is configured to determine whether the first switch module is operating in the reverse conduction mode within an interlock time, between switching off the second switch module and switching on the first switch module, that is imposed by a control circuit coupled to the drive circuit.

14. The system of claim 10, wherein the sense circuit comprises a current sense circuitry configured to determine a polarity of a current flowing through the first switch module, wherein the sense circuit is configured to determine whether the first switch module is operating in the reverse conduction mode based on the polarity of the current.

15. The system of claim 14, wherein the current sense circuitry is configured to provide a current estimation by measuring a voltage across a parasitic inductance disposed between a control terminal of the first switch module and a power terminal of the first switch module.

16. The system of claim 14, wherein the sense circuit comprises a voltage sense circuitry configured to determine the voltage polarity across power terminals of the first switch module, and wherein the sense circuit is configured to determine whether the switch module is operating in the reverse conduction mode based on the voltage polarity.

17. The system of claim 16, wherein the voltage sense circuitry comprises a current source coupled to a collector terminal of the first switch module through a diode, wherein an output of the voltage sense circuitry is responsive to a voltage of the collector terminal.

18. The system of claim 16, wherein the voltage sense circuitry comprises a voltage divider circuit with a following comparator or analog digital converter.

* * * * *